United States Patent
Pathak et al.

[19]

[11] Patent Number: 5,999,038
[45] Date of Patent: Dec. 7, 1999

[54] FUSE CIRCUIT HAVING ZERO POWER DRAW FOR PARTIALLY BLOWN CONDITION

[75] Inventors: Saroj Pathak, Los Altos Hills; James E. Payne, Boulder Creek, both of Calif.

[73] Assignee: Atmel Corporation, San Jose, Calif.

[21] Appl. No.: 09/160,526

[22] Filed: Sep. 24, 1998

[51] Int. Cl.[6] .................................................. H01H 37/76
[52] U.S. Cl. ........................................ 327/525; 365/225.7
[58] Field of Search ............................. 361/58; 307/113, 307/115, 116; 365/96, 225.7, 200; 327/524, 525, 199, 203; 326/37, 39, 50

[56] References Cited

U.S. PATENT DOCUMENTS

| | | | |
|---|---|---|---|
| 4,613,959 | 9/1986 | Jiang | 365/200 |
| 4,837,520 | 6/1989 | Golke et al. | 324/550 |
| 5,038,368 | 8/1991 | Lee | 377/28 |
| 5,442,589 | 8/1995 | Kowalski | 365/225.7 |
| 5,457,656 | 10/1995 | Fu | 365/200 |
| 5,491,444 | 2/1996 | McClure | 327/525 |
| 5,517,455 | 5/1996 | McClure et al. | 365/225.7 |
| 5,731,734 | 3/1998 | Pathak et al. | 327/525 |
| 5,901,094 | 5/1999 | Chin et al. | 365/200 |

*Primary Examiner*—Jeffrey Gaffin
*Assistant Examiner*—Kim Huynh
*Attorney, Agent, or Firm*—Thomas Schneck

[57] ABSTRACT

A fuse circuit includes a fusible element and a feedback path which causes the circuit to behave as if the fusible element is fully blown even though the fusible element in fact is partially intact. While a partially intact fuse normally would result in a continuous drain of power, the feedback path cuts off the current flow through the partially intact fusible element.

10 Claims, 1 Drawing Sheet

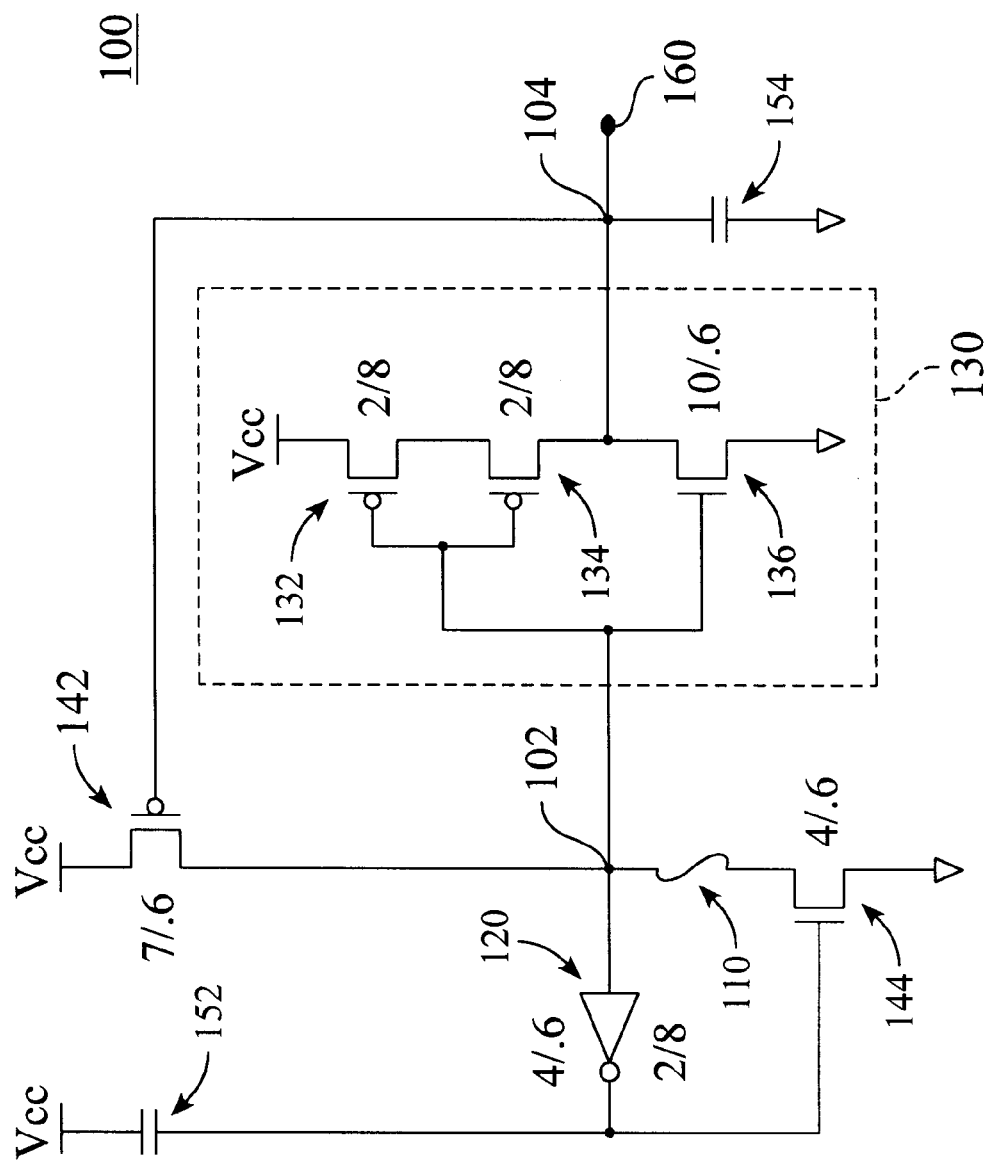
Figure

FUSE CIRCUIT HAVING ZERO POWER DRAW FOR PARTIALLY BLOWN CONDITION

TECHNICAL FIELD OF THE INVENTION

The present invention generally relates to fuse circuits, and more specifically to a fuse circuit which exhibits zero power draw in a partially blown state.

BACKGROUND ART

Fuse circuits are frequently used in various semiconductor applications. For example, as the storage density of semiconductor devices such as memories, programmable logic devices, and the like continue to increase, the incidence of defective cells within any one device is likely to increase as well. Unless the defect can be corrected in some way, the particular defective semiconductor device becomes useless, thus lowering production yields. A common approach to correcting such defects is to provide a multitude of redundant cells within the device. When a defective cell is detected, one of the redundant cells can be used in its place. The circuitry that supports the redundant cells usually include fuse circuits containing fusible links which are selectively "blown" in order to activate one or more of the redundant cells.

Fuse circuits are also used to facilitate programming of programmable logic devices (PLD). Typically, logic cells in a PLD are fabricated to have a default logic level, whether it be a logic HI or a logic LO. This is accomplished by the presence of fusible links which tie the cells' outputs either to $V_{cc}$ or to ground. When a fusible link in a cell is blown, the cell's output reverses.

An important consideration with such fusible links is that they consume power. An especially problematic situation exist when a fuse is partially or not completely blown. The result is a current path across the fuse, which is undesirable for two reasons: First, the partial fuse is likely to create an indeterminate connection state. Depending on the resistance of the partially blown fuse, the surrounding circuitry may "see" an open or a short. Consequently, the device is not likely to behave as expected. Second, even if the circuitry sees an open circuit across the partially blown fuse, there will be a current leakage across the fuse. The amount of current can be 1 $\mu$A or more which can add up to a significant current draw for a typical application employing redundant circuits.

What is needed is a fuse circuit which can reliably provide a completely "blown" state. It is desirable that the fuse circuit behave as if it were completely blown even though the fusible link is in fact partially blown.

SUMMARY OF THE INVENTION

The circuit of the present invention includes a fusible link having first and second terminals. First and second inverters are coupled to a second terminal of the link. An N-channel switching transistor is coupled between the first terminal and a ground rail. A P-channel switching transistor is coupled between the second terminal and a power rail. The N-channel transistor is driven by the output of the first inverter, while the P-channel transistor is driven by the second inverter. The first inverter is characterized by having an N-channel transistor that is weaker than its P-channel transistor. Similarly, the second inverter is characterized by a P-channel transistor that is weaker than its N-channel transistor. A first capacitor is coupled between the power rail and the control gate of the N-channel switching transistor. A second capacitor is coupled between the control gate of the P-channel switching transistor and the ground rail.

BRIEF DESCRIPTION OF THE DRAWINGS

The FIGURE shows the preferred embodiment of the present invention.

BEST MODE FOR CARRYING OUT THE INVENTION

With reference to the FIGURE, a fuse circuit 100 in accordance with the present invention includes a fusible element 110, a first end of which is coupled to an N-channel transistor 144 and a second end of which is coupled to a node 102. N-channel transistor 144 has a drain-source connection between the second end of fuse 110 and ground potential. A P-channel transistor 142 has a source-drain connection between $V_{CC}$ and the first end of fuse 110.

A first inverter 120 is coupled between the first end of fuse 110 and the control gate of N-channel transistor 144. A capacitor 152 is coupled between $V_{CC}$ and the control gate of transistor 144. First inverter 120 includes an N-channel transistor that is weaker than its P-channel transistor. This is indicated in the FIGURE by the W/L ratio annotations associated with inverter 120. As indicated in the FIGURE the W/L ratio of the P-channel device is 4/0.6 and the W/L ratio of the N-channel device is 2/8. The significance of these device geometries will be explained below.

A second inverter 130 is shown by the circuit encompassed by the dashed line. Second inverter 130 is coupled between the first end of fuse 110 and the control gate of P-channel transistor 142. A second capacitor 154 is coupled between the control gate of transistor 142 and ground. A node 104 coupled to the output of second inverter 130 indicates the state of fuse 110, namely whether it is in the intact state or in the blown state. As can be seen in the FIGURE P-channel transistors 132 and 134 comprising inverter 130 have W/L ratios (W/L=2/8) that are smaller than the W/L ratio of the N-channel transistor 136 (W/L=10/0.6).

There are three scenarios to discuss in connection with operation of fuse circuit 100: operation when fuse element 110 is intact; operation when the fuse element is fully blown; and operation when the fuse element is partially blown. Consider first the situation where fuse element 110 is intact. Upon power up, capacitor 152 begins to charge thus turning on transistor 144 while capacitor 154, initially at ground potential, turns on transistor 142. This creates a current path from $V_{CC}$ to ground through fuse element 110. However, since transistor 144 is conducting, node 102 tends toward ground potential which causes the output of inverter 120 to go HI. This operates to maintain transistor 144 in the on state. At the same time, transistors 132 and 134 are turned on thus bringing node 104 to $V_{CC}$. This has the effect of (1) turning off transistor 142 and (2) charging capacitor 154 which maintains transistor 142 in the off state. Thus, in the steady state condition where fuse element 110 is intact, transistor 144 remains on by way of inverter 120 and transistor 142 remains off by way of inverter 130. However, since transistor 142 is off, there is no current flow through transistor 144. In addition, the initial current flow through transistors 132 and 134 exists only long enough to charge capacitor 154, afterwhich current flow through those transistors ceases. The potential at output node 160 remains at $V_{CC}$ without an power drain by fuse circuit 100.

As evidenced by the W/L ratios shown in the FIGURE the N-channel device of inverter 120 is weaker than the P-channel device. This has the effect of raising the potential that node 102 must attain before inverter will output a LO. The reason for this behavior is to prevent a false turn-off of transistor 144 in the case when the fuse is intact, since even an intact fuse has some resistance (roughly 500 ohms) and the potential at node 102 is in actuality not at ground potential. However, by properly dimensioning the P-channel device in inverter 120, the P-channel device can be made to switch on before the N-channel device, even though the potential at the inverter input is not at ground.

Consider next the situation where fuse element 110 is completely blown. In this case, transistor 144 is disconnected from the rest of the circuit. However, as before, transistor 142 begins to turn on since capacitor 154 is initially at ground potential. As a result, the potential at node 102 approaches $V_{CC}$. This action has two effects: it drives the output of inverter 120 LO; but more significantly, it turns on transistor 136. Turning on transistor 136 maintains node 104 and capacitor 154 at ground potential and keeps transistor 142 turned on. Since transistor 144 is disconnected by virtue of the blown fuse, there is no current path from $V_{CC}$ to ground. However, since transistor 142 is in the on state, the potential at node 102 remains at $V_{CC}$, thus maintaining a LO output from inverter 130. Thus, in the steady state, output node 160 is LO and again there is no power drain through any of the circuit elements of fuse circuit 100.

Consider the final case where fuse element 110 is partially blown. In such a case, fuse element 110 behaves like a high impedance resistive element. As before when the circuit is powering up, capacitor 152 turns on transistor 144 and the initial ground potential at capacitor 154 turns on transistor 142. Since fuse element is partially blown, a current path exists from $V_{CC}$ to ground via the partially blown element. Moreover, since the partially blown element is resistive, the potential at node 102 is higher than if the fuse element is fully intact. Since N-channel transistor 136 is so much stronger than P-channel transistors 132 and 134, it will switch on faster thus keeping transistor 142 on. This causes the potential at node 102 to continue rising as fuse circuit 100 continues powering up. The potential at node 102 eventually reaches a level which causes the N-channel transistor of inverter 120 to turn on which causes the output of the inverter to go LO, thus turning off transistor 144. This eliminates the current path to ground despite the presence of the partially blown fuse element. Fuse circuit 100 therefore behaves as if fuse element 110 had been fully blown when in fact that is not the case.

We claim:

1. A fuse circuit comprising:
    a fusible link having first and second terminals;
    first and second inverters, each having an input coupled to said second terminal, said first inverter having a first output, said second inverter having a second output, said first and second outputs each having a first and a second logic level;
    a first switch coupled between a ground rail and said first terminal, said first switch having a control terminal coupled to receive said first output and having a conductive state when said first output is at said first logic level; and
    a second switch coupled between a power rail and said second terminal, said second switch having a control terminal coupled to receive said second output and having a conductive state when said second output is at said a second logic level.

2. The fuse circuit of claim 1 further including a first capacitor coupled between said power rail and said control terminal of said first switch and a second capacitor coupled between said ground rail and said control terminal of said second switch.

3. The fuse circuit of claim 1 wherein said first switch is a P-channel transistor and said second switch is an N-channel transistor.

4. The fuse circuit of claim 1 wherein said first inverter includes a series-connection of an N-channel transistor and a P-channel transistor, said N-channel transistor having a W/L ratio smaller than that of said P-channel transistor.

5. The fuse circuit of claim 4 wherein said second inverter includes a series-connection of an N-channel transistor and at least one P-channel transistor, said N-channel transistor having a W/L ratio greater than that of said at least one P-channel transistor.

6. A fuse circuit comprising:
    a power terminal for being coupled to a power supply;
    a ground terminal for being coupled to ground potential;
    a first transistor of a first conductivity type having first, second and gate terminals, said first terminal being coupled to said power terminal;
    a fuse element having first and second terminals, said first terminal being coupled to said second terminal of said first transistor;
    a second transistor of a second conductivity type having first, second and gate terminals, said second terminal being coupled to said first terminal of said fuse element, said first terminal being coupled to said ground terminal;
    an inverter having an input terminal coupled to said first terminal of said fuse element and an output terminal coupled to said gate terminal of said second transistor;
    third and fourth series-coupled transistors each of said first conductivity type and having first, second and gate terminals, said third and fourth transistors being coupled between said power terminal and said gate terminal of said first transistor, said gate terminals of said third and fourth transistors being coupled to said first terminal of said fuse element; and
    a fifth transistor of said second conductivity type having first, second and gate terminals, said second terminal being coupled between said first terminal of said fuse element and said ground terminal.

7. The fuse circuit of claim 6 wherein said inverter includes a P-channel transistor and an N-channel transistor, said P-channel transistor having a W/L ratio that is greater than that of said N-channel transistor.

8. The fuse circuit of claim 7 further including a capacitor coupled between said power terminal and said gate terminal of said second transistor.

9. The fuse circuit of claim 6 wherein said third and fourth transistors each has a W/L ratio that is less than that of said fifth transistor.

10. The fuse circuit of claim 9 further including a capacitor coupled between said gate terminal of said first transistor and said ground terminal.

* * * * *